United States Patent [19]

Bobrov et al.

[11] 4,170,737

[45] Oct. 9, 1979

[54] TOP-ENTRY TRANSMISSION ELECTRON MICROSCOPE

[75] Inventors: Gennady N. Bobrov; Mikhail I. Shishkov; Gennady I. Kuzin; Evgeny G. Ivanov, all of Puschino Moskovskoi oblasti; Igor M. Akimov, Moscow, all of U.S.S.R.

[73] Assignee: Spetsialnoe Konstruktorskoe Bjuro Biologicheskogo Priborotroenia Akademii Nauk SSSR, U.S.S.R.

[21] Appl. No.: 922,382

[22] Filed: Jul. 6, 1978

[51] Int. Cl.² ............................................. G21K 5/06
[52] U.S. Cl. ................................. 250/442; 250/311
[58] Field of Search ............... 250/442, 440, 435, 311, 250/306

[56] References Cited

U.S. PATENT DOCUMENTS

| | | | |
|---|---|---|---|
| 3,230,365 | 1/1966 | Nagahama | 250/442 |
| 3,240,934 | 3/1966 | Watanabe et al. | 250/442 |
| 3,308,294 | 3/1967 | Ozasa | 250/442 |
| 3,714,423 | 1/1973 | Lucas | 250/442 |
| 3,952,203 | 4/1976 | Hoppe | 250/442 |
| 4,058,731 | 11/1977 | Müller et al. | 250/442 |

FOREIGN PATENT DOCUMENTS 1320346 6/1973 United Kingdom .

OTHER PUBLICATIONS

"A High-Angle Tilting Stage for the 650 Ku Hitachi Electron Microscope," Bouchard et al., Rev. of Scien. Ins., No. 4, vol. 44, Apr. 1973, pp. 511-512.

*Primary Examiner*—Bruce C. Anderson
*Attorney, Agent, or Firm*—Fleit & Jacobson

[57] ABSTRACT

A top-entry transmission electron microscope comprises a stage with a changeable cartridge which houses a specimen holder spaced in the magnetic lens field and tiltable about the axis x perpendicular to the microscope optical axis. An executive step motor of the specimen holder's electric drive is mounted on the stage and has a rotor mechanically coupled with the specimen holder for the rotor and holder to be turned synchronously. The microscope comprises also a rocker pivotally mounted in the changeable cartridge and designed to convey the drive to the rotor via a drive transmitting member; a rotor-turning piezoelectrically actuated electro-mechanical means and a rocker-positioning piezoelectrically actuated electromechanical means which are connected, respectively, to a control voltage shaper of the step motor and to a unit for settling the magnitude and sence of specimen holder displacement. The disclosed microscope features a lower level of drift of the tiltable specimen holder, widened up to 360° range of specimen tilt angles, and a greater speed of obtaining stereopair micrograpgs.

16 Claims, 15 Drawing Figures

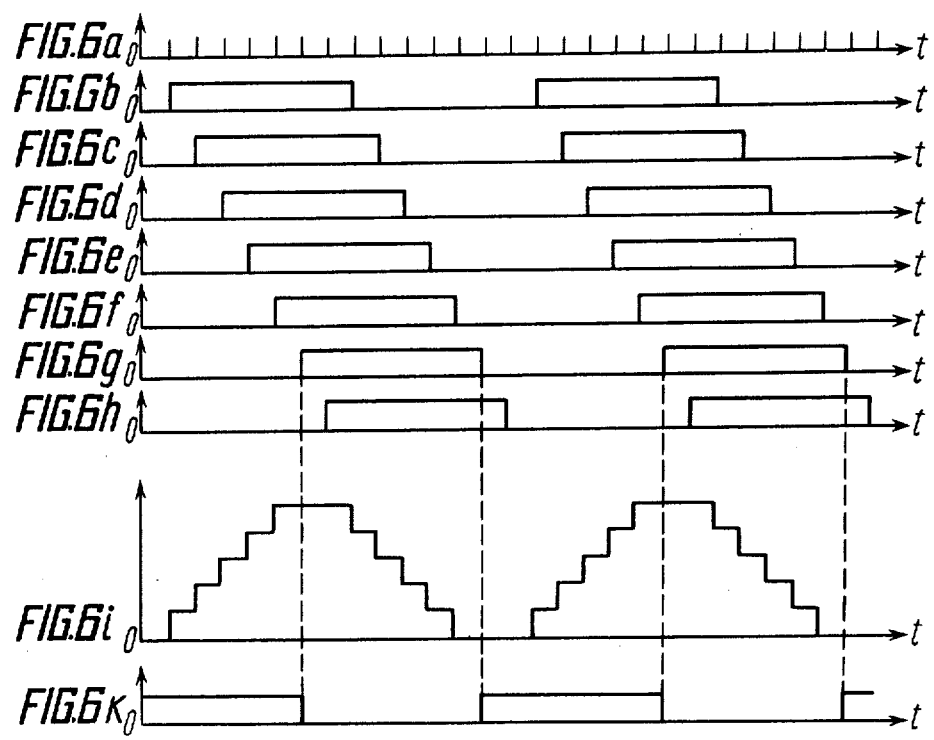

TOP-ENTRY TRANSMISSION ELECTRON MICROSCOPE

This invention relates to scientific instrumentation, particularly, to a top-entry transmission electron microscope used, mainly, in high resolution transmission electron microscopy.

The present invention may be utilized for obtaining information in the studies of spatial organization of biological microobjects at the molecular level.

A prerequisite for the solution of problems dealing with the three-dimensional reconstruction of biological macro molecules is the high resolution—better than 10 Å—of an electron microscope. No less important parameters for the solution of these problems are the range of specimen holder tilt angles and the stability of tiltable specimen holder construction badly affecting the quality of micrographs.

Another important parameter of an electron microscope is the speed the micrographs can be taken with since the lifetime of irradiated biological microobjects under study happens to be a few seconds. The situation required then that the object be brought under the beam only for the period of photosensitive material's exposition. A success in obtaining stereo pairs of the investigated microobject is possible only when the tiltable specimen holder has a mechanism for bringing the microobject into coincidence with the tilt axis. The procedure is known as Z-control. Z-control eliminates translation and defocusing of the image when the specimen holder is tilted thereby minimizing the time spent on preparatory operations when photographing stereo pairs.

Tiltable specimen holders in electron microscopes with the axial loading of specimens have a limited range of tilt angles (e.g., see Review of Scientific Instruments, 44, No. 4, pp. 511-512, 1973, "A High-Angle Tilting Stage for 650 kV Hitachi Electron Microscope," M. Bouchard, etc.). Besides, all conventional makes of electron microscopes of the kind specified have no devices for Z-control.

A conventional top-entry transmission electron microscope comprises a specimen stage with a removable cartridge housing a specimen holder positioned in the lens field and tiltable about the axis (x) which is perpendicular to the microscope's optical axis, and an electric drive of the holder having a step servomotor electrically connected with the unit for setting the magnitude and direction of the holder displacement and with the unit for settling the magnitude and direction of the holder displacement and with the control voltage shaper (e.g., see FRG Pat. No. 1614528 of 1971).

The specimen holder in a microscope of the kind specified above is actuated by the servomotor through a special vacuum-tight sealed shaft furnished with an electromagnetic clutch to disengage the shaft from the motor during the manual control. The electric step motor is located on the external surface of the electron microscope column, its pulse setting device being designed so as to make the number of control pulses determine the magnitude of the desired specimen displacement.

The presence of lengthy mechanical links between the actuating step motor and the specimen holder brings about the high level of drift. The level of drift of the tiltable specimen holder depends on the value of torque on the motor's shaft influenced in its own turn by the condition of the vacuum-tight sealing. Thus, the image drift becomes a factor which limits the maximum possibilities of the electron microscope. The absence of facilities for Z-control results in inevitable translation of image and its defocusing when the specimen holder is tilted, which precludes maintaining the set degree of magnification throughout the range of tilt angles.

One object of the present invention is to provide a top-entry transmission electron microscope possessing a reduced level of the tiltable specimen holder drift.

Another object of the invention is to increase the range of the specimen holder tilt angles.

Yet another object of the invention is to eliminate image wanderings caused by changes in the size of projection of the tilted specimen.

Still another object of the invention is to maintain the set degree of magnification throughout the range of tilt angles.

And another object of the invention is to provide angular displacements for the step motor's rotor not multiple to the integral number of steps.

The present invention is basically intended to solve the problem of providing a top-entry transmission electron microscope in which the location and construction of the actuating step motor of the specimen holder's electric drive together with the realization of the electric control circuitry would make it possible to reduce the drift of the tiltable specimen holder and increase its range of tilt angles, eliminate wandering off of the specimen image caused by the changes in the size of projection, maintain the set degree of magnification throughout the full range of tilt angles and ensure that the rotor of the step motor could be displaced by the value not multiple to the integral number of steps.

The problem is solved by providing a top-entry transmission electron microscope comprising a specimen stage with removable cartridge housing a specimen holder mounted in the field of magnetic lens so that it can be tilted about the axis "x" perpendicular to the optical axis of the microscope, and an electric drive for the specimen holder having an actuating step motor electrically connected with a unit for setting the magnitude and sense of the specimen holder displacement and with its control voltage shape circuit, in which, according to the invention, the actuating step motor is mounted on the specimen stage and has a rotor the axis of which is made coincident with the "x" axis and which is mechanically coupled with the specimen holder to ensure synchronous turning of the rotor and specimen holder, a piezoelectrically actuated electromechanical means for turning said rotor, a drive transmitting member secured on said electromechanical means, a rocker geared to said drive transmitting member to convey drive to said rotor and pivotally mounted within the removable cartridge so that it can be displaced longitudinally with respect to its pivot fulcrum, a second piezoelectrically actuated electromechanical means for moving said rocker and mechanically coupled with said drive transmitting member, said control voltage shaper circuit of the step motor representing a Johnson code distributor and a code-to-voltage converter connected in series, its output serving as an analogue output of said control voltage shaper circuit connected to said first electromechanical means for turning the rotor, while the unit for setting the magnitude and sense of the specimen holder displacement comprises a control unit and a synchronization unit connected in series, its clock-pulse output being connected to said control voltage shaper, its control output to said second electromechanical means for displacing the rocker, while the inputs of said control unit are fed with the signals of "start," "stop," "reset," "clock-pulse frequency," "sense of displacement" and "magnitude of displacement."

Preferably, a transmission electron microscope should be provided with a positioning mechanism for bringing the specimen into coincidence with the "x" axis which would comprise a bearing pulley mounted on a rotor so that it could turn about the "x" axis, a means for braking said bearing pulley against the removable cartridge, and a crank-link mechanism the crank of which would be on said bearing pulley, the link of which would have a seat for the specimen, while the axis of said link would be fixed in said rotor perpendicularly to the "x" axis and lie in the specimen plane, there should also be provided a switch with its input joined to the control output of the synchronization unit and its outputs joined to the electromechanical means of rocker displacement of the step motor and to the electrical input of said bearing pulley braking means, respectively.

It will be expedient to provide a transmission electron microscope with a mechanism for translating the link in the specimen plane which would comprise a second bearing pulley with a crank mounted on the rotor so that it could turn about the "x" axis, a means for braking said second bearing pulley against the removable cartridge, there being a slot made in the link arm perpendicular to its axis geared with said crank of said second bearing pulley the switch then should be provided with an additional output joined to the electrical input of said braking means of said second bearing pulley.

It will be useful to provide the braking means of each bearing pulley with a brake rocker pivotally mounted in the removable cartridge to be engaged with its bearing pulley during braking, and to have on the specimen stage additional electromechanical means to actuate the rockers during braking.

It is advantageous to use piezoelectric elements for actuation of said electromechanical means.

Preferably, the rotor of step motor should have a gear rim, and the end of rocker engaged with the rotor should bear a tooth the profile of which would be complementary to the tooth space profile of said gear rim.

It will be expedient to have the pilot securing the rocker of step motor made in the form of an elastic cantilever with one end fixed in the body of removable cartridge and the other, free, end bearing the rocker rigidly secured to it.

It will be useful to ensure that the ends of said rockers interacting with said electromechanical means and with the drive transmitting member of said step motor be provided with a means for increasing friction.

Conveniently said control unit should comprise a clock-pulse generator whose input would be the "clock-pulse frequency" input of the unit for setting the magnitude and sense of specimen holder displacement; a first flip-flop the S-input of which would serve as the "start" input of said setting unit; a second flip-flop the S-input of which would be connected to the S-input of said first flip-flop its R-input being connected to the R-input of said first flip-flop; a logical OR circuit whose inputs would serve as the "stop" and "reset" inputs of said setting unit, respectively; a coincidence circuit for the codes of the set and current values of rotor displacement the input of which would serve as the "magnitude of displacement" input of said setting unit, and its output being connected to one of the inputs of said logical OR circuit, the output of the latter being connected to said R-inputs of flip-flops; a bidirectional counter with its output joined to the comparison input of said coincidence circuit and its input serving as the count input of said control unit; a switch whose control input would serve as the "sense of displacement" input of said setting unit and would be joined to the control input of said bidirectional counter, while its clock input would be connected to the "reset" input of said logical OR circuit.

Preferably said synchronization unit should comprise a first logical AND circuit the inputs of which would be joined to the output of said clock-pulse generator and to the Q-output of said first flip-flop of said control unit, the output of said AND circuit serving as the output of clock pulses of said setting unit; a single-shot multivibrator with its inverted output joined to the input of said logical AND circuit while its input would be joined to the P-output of said second flip-flop of said control unit; a second logical AND circuit having its inputs joined to the P-output of said second flip-flop, to the Q-output of said first flip-flop, and to the output of said switch of said control unit, while its output would serve as the control output of said setting unit; a third logical AND circuit with its input joined to the output of said switch of said control unit and its input joined to the complementing input of said second flip-flop of said control unit; a fourth logical AND circuit with its inputs joined to the output of said first AND circuit and to the output of said second AND circuit, while its output would be joined to the count input of said bidirectional counter.

It will be expedient to provide the Johnson code distributor with an n-digit Mobius ring counter whose count input would be joined to the clock-pulse output of said setting unit, its "reset" input being joined to the "reset" input of said setting unit; a logical 2AND-to-2OR circuit with its inputs joined to the Q-output of the 1st digit, to the P-output of the m.s. digit, to the P-output of the 1-st digit, and to the Q-output of the m.d. digit, respectively, of said Mobius ring counter, while its output would be joined to the input of said fourth logicsl AND circuit of said synchronization unit; said Mobius ring counter should comprise at least one redundant digit inserted between said l.s. and m.s. digits, the P- and Q-outputs of one of said redundant digits being connected to the inputs of said switch of the control unit.

It will also be expedient to provide said code-to-voltage converter with a nonlinear Johnson-code-to-voltage converter whose inputs would be joined to the outputs of said Mobius ring counter, and whose output would be joined to said electromechanical means of step motor; with a linear Johnson-code-to-voltage converter also having its inputs joined to the outputs of said Mobius ring counter; with a comparator the input of which would be joined to the output of said linear converter; an analogue storage having its input joined to the output of said linear converter through a gate and its output joined to the other input of said comparator the output of which would be joined to the input of said third logical AND circuit of said synchronization circuit, while the control input of said gate would be joined to the output of said logical OR circuit of said control unit.

The disclosed top-entry transmission electron microscope is characteristic of a reduced level of drift of the tiltable specimen holder achieved by the rational positioning of the actuating step motor in the immediate vicinity to the specimen, on the goniometer stage. It is exclusively this implementation of the drive that has made it feasible to place the actuating motor on the same axis with the specimen holder. This permitted the number of external mechanical links of the tiltable specimen holder to be reduced to only two pivoting supports with predetermined frictional moment. The proposed microscope is also characteristic of a wider range of specimen holder tilt angles, i.e. up to 360°, which allows obtaining "mirror" image of specimens and determining the position of the stereopair axis with them in a simple and straightforward manner. The bearing pullies and the crank-link mechanism will preclude the specimen image from wandering away which would otherwise happen owing to changes in the size of tilted specimen and will allow the set degree of magnification to be maintained throughout the entire range of tilt angles. The specimen holder drive control circuitry in the microscope according to the invention permits the angular displacements of the step motor's rotor to be executed both by integral steps and by fractions of a step, which enables one to view the investigated specimen from any desired angle.

An embodiment of the present invention will be described in the following with reference to the accompanying drawings, in which:

FIG. 6 shows the diagrams of signals at the outputs of control voltage shaper circuit elements, according to the invention.

Figure 1:
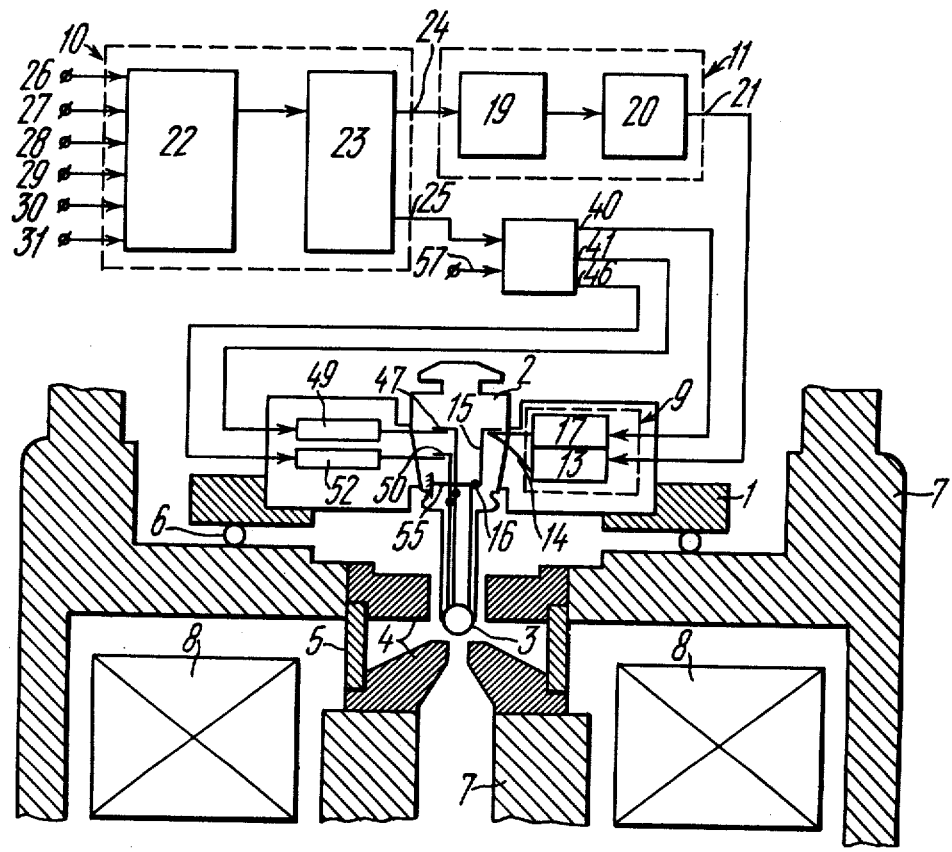
FIG. 1 is a schematic sectional view of a top-entry transmission electron microscope with a block-diagram of goniometer drive, according to the invention.

A top-entry transmission electron microscope comprises a specimen stage 1, FIG. 1, with a removable cartridge 2 housing a specimen holder 3. The specimen holder 3 is mounted in the gap of pole pieces 4 of the magnetic lens. Between the pole pieces there is mounted an insertion 5 made of non-magnetic material. The stage 1 is installed on spherical bearings 6 in the microscope column 7 which serves also as a magnetic circuit for the magnetic lens. The microscope's magnetic field is formed by a magnetizing coil 8. The specimen holder 3 is mounted so that it can be tilted about the axis x perpendicular to the microscope's optical axis, it is provided with an electric drive with an actuating step motor 9 electrically connected with a unit 10 for setting the magnitude and sense of displacement of the specimen holder and with a control voltage shaper 11 for the step motor.

Figure 2:
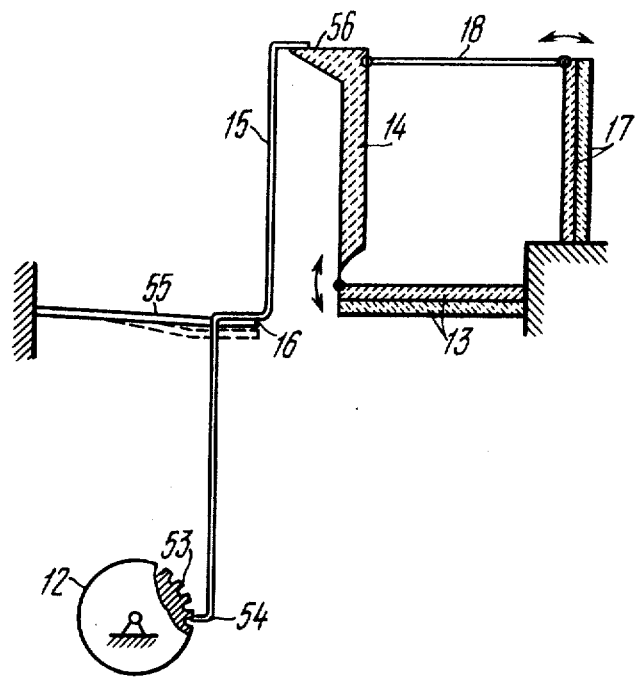
FIG. 2 is a functional diagram of a piezoelectrically actuated step motor mechanism, according to the invention.

The actuating step motor 9 is mounted on the stage 1 and comprises a rotor 12, FIG. 2, which has its axis in coincidence with the x axis and is mechanically coupled with the specimen holder 3. The moment of friction in the bearings of the rotor 12 is smaller than the moment developed by the step motor 9. The step motor 9 comprises a piezoelectrically actuated electromechanical means 13 for turning the rotor and a drive transmitting member 14 pivotally attached to the electromechanical means 13. In the removable cartridge 2 there is a pivotally secured rocker 15 to convey drive further to the rotor 12. The rocker 15 is secured so that it can move translationally with respect to its fulcrum 16. It is also in gear with the drive transmitting member 14 and has an initial offset along the electron microscope optical axis which exceeds its maximum possible travel in this direction during operation. There is another piezoelectrically actuated electromechanical means 17 for deflecting the rocker interacting with the drive transmitting member 14 via a rod 18.

The control voltage shaper 11, FIG. 1, of the step motor comprises a Johnson code distributor 19 and a code-to-voltage convertor 20 connected in series, an output 21 serves as the analogue output of the control voltage shaper 11. The electromechanical means 13 for turning the rotor is connected to the output 21. The unit 10 for setting the magnitude and sense of the specimen holder displacement comprises a control unit 22 connected in series with a synchronization unit 23 having its clock pulse output 24 joined to the control voltage shaper 11, and its control output 25—to the electromechanical means 17 for rocker deflection. An input 26 of the control unit 22 serves to receive the "start" signals given by the operator. Inputs 27,28,29,30, and 31 are meant for receiving the signals of "stor," "reset," "clock pulse frequency," "sense of displecement," and "magnitude of displacement," respectively. All these signals are also given by the operator.

The microscope comprises a mechanism for bringing the specimen into coincidence with the x axis constructed in the following manner. On the rotor 12 of the step motor there is mounted a bearing pulley 32, FIG. 3, rotatable about the axis x. There is a braking means 33 for braking the pulley 32 with respect to the removable cartridge body 2. Also mounter in the rotor 12 is a crank-line mechanism 34 whose crank 35 is secured on the bearing pulley 32.

Figure 4:
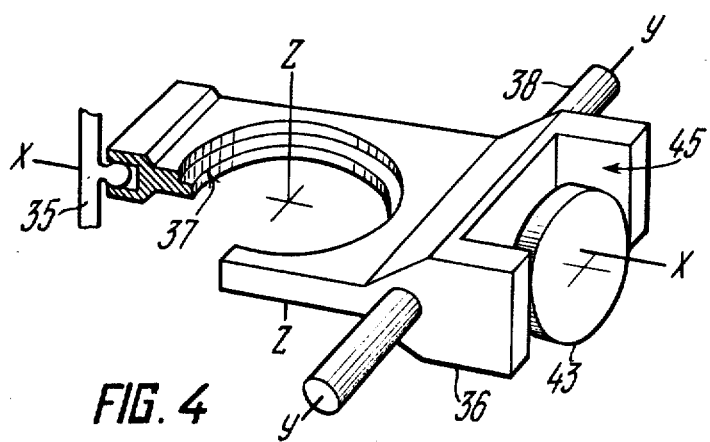
FIG. 4 is a perspective cutaway view of a link of crank-link mechanism, according to the invention.

A link 36, FIG. 4, has a seat 37 for housing a specimen. In this case, the link 36 serves as a specimen holder. The axis y of link pin 38 lies in the specimen plane perpendicular to the x axis. The link pin 38 is mounted in the rotor 12, FIG. 3. There is also a switch 39, FIG. 1, whose input is joined to the control output 25 of synchronization unit 23, while its outputs 40 and 41 are joined, respectively, to the electromechanical means 17 for rocker deflection and to the braking means 33 of the bearing pulley 32.

Figure 3:
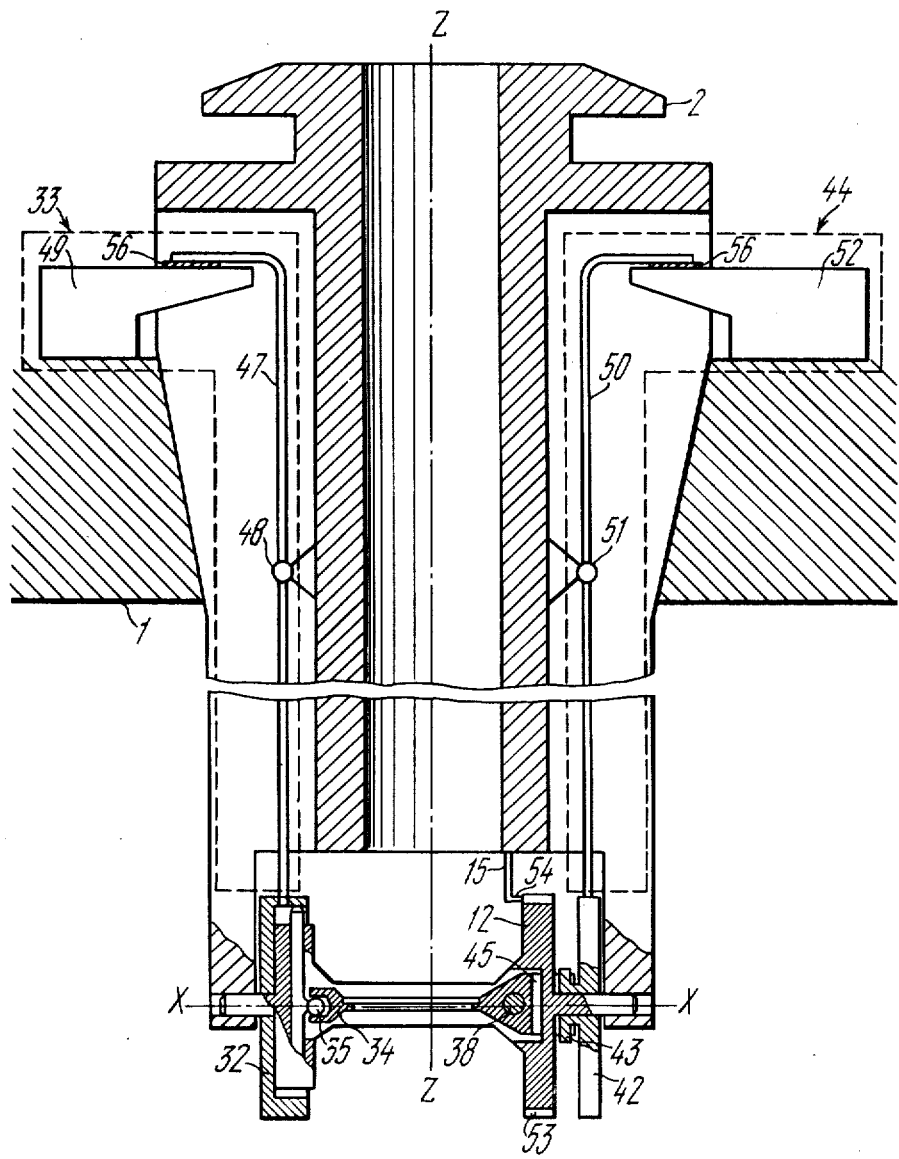
FIG. 3 is a schematic sectional view of a removable cartridge for the microscope, according to the invention.

The microscope is also provided with a mechanism for translating the link 36 in the specimen plane which comprises a second bearing pulley 42, FIG. 3, rotatable about the x axis mounted on the rotor 12 and bearing a crank 43. There is a braking means 44 for braking the second bearing pulley 42 against the removable cartridge body 2. In the body of the link 36 there is a slot 45 cut perpendicular to its pin 38 to house the crank 43 of the second pulley 42. Correspondingly, the switch 39, FIG. 1, has an additional output 46 connected to the braking means 44 of the second bearing pulley 42.

The braking means 33, FIG. 3, of the bearing pulley 32 comprises a braking rocker 47 secured in a pivot 48 in the removable cartridge 2 for interaction with the bearing pulley 32 during braking. Accordingly, the stage 1 is provided with a third electromechanical means 49 for actuating the rocker 47 during braking.

Similarly, the braking means 44 of the bearing pulley 42 comprises a braking rocker 50 secured in a pivot 51 in the removable cartridge 2 for interaction with the bearing pulley 42 during braking.

In the described embodiment of the invention, the electromechanical means 49 and 52 have piezoelectric elements for actuators.

The rotor 12 of the step motor 9 is provided with a gear rim 53, whereas the end of the rocker 15 geared with the rotor 12 has a tooth 54 the profile of which is complementary to the profile of the tooth space of the gear rim 53.

The pivot 16 bearing the rocker 15 of the step motor 9 is made in the form of an elastic cantilever element 55, one end of which is fixed in the body of removable cartridge 2 and the other serves to bear the rocker 15. This free end of the cantilever element 55, FIG. 2, is given an initial offset towards the rotor 12 along the optical axis.

At the ends of the rocker 15,47,50 interacting with the electromechanical means 49,52 and with the drive transmitting member 14 of stepmotor 9, there is a means 56 arranged to increase friction. In the described embodiment, the means 56 is made of indium.

The second input 57 of the switch 39 serves to receive the instructions of "sample holder coordinate selection" which is fed in by the operator.

Figure 5:
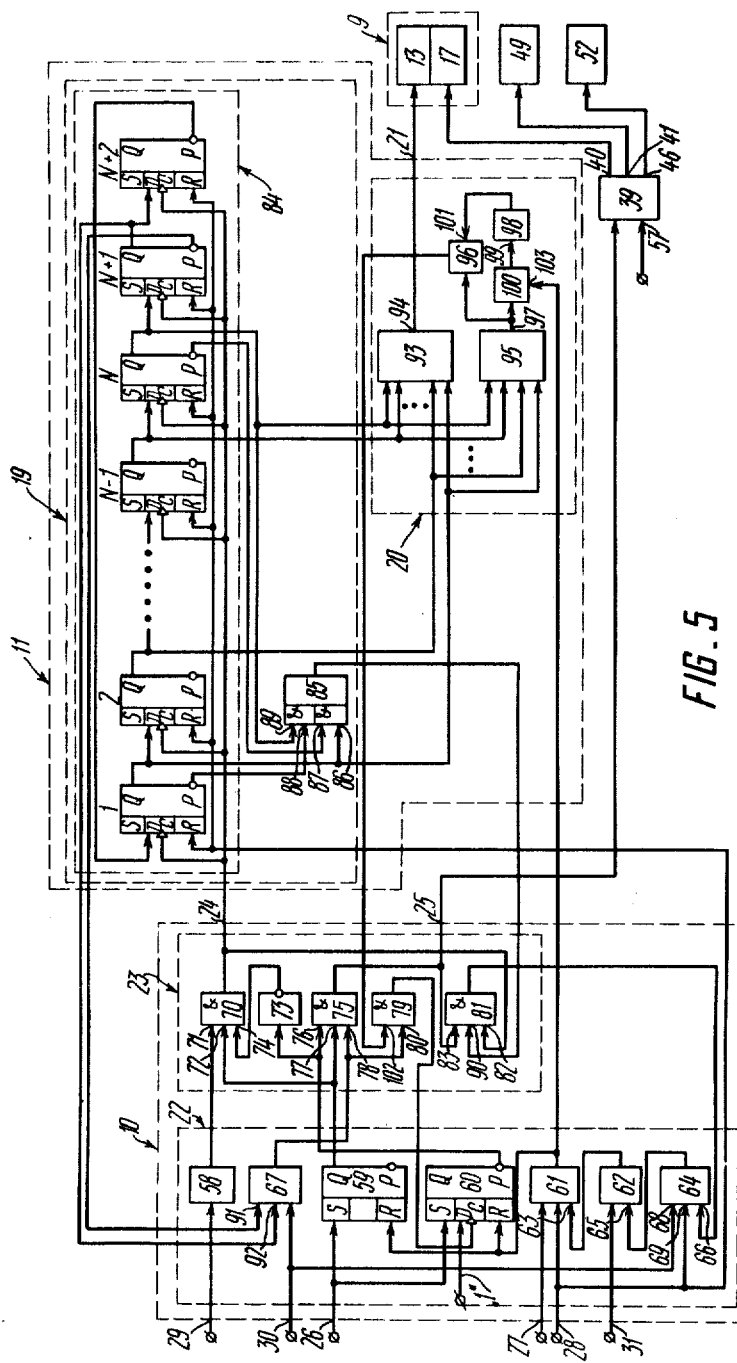
FIG. 5 is a block-diagram of a specimen holder drive circuit for the electron microscope, according to the invention.

The control unit 22, FIG. 5, comprises a clock pulse generator 58 the input of which serves as the "clock pulse frequency" input 29 of the unit 10 for setting the magnitude and sense of sample holder displacement. The control unit 22 comprises also a flip-flop 59, the S-input of which serves as the "start" input 26 of the unit 10, a second lip-flop 60, the S-input of which is joined to the S-input of the flip-flop 59, while its R-input is joined to the R-input of the flip-flop 59. The unit 22 comprises also a logical OR circuit 61 whose inputs serve as the "stop" input and the "reset" input of the unit 10, a coincidence circuit 62 for the set and current value codes of the rotor displecement, the input of which serves as the "magnitude of displacement" input 31 of the unit 10, its output being connected to a third input 63 of the logical OR circuit 61 whose output is joined to the R-inputs of the flip-flops 59 and 60. The control unit 22 comprises also a bidirectional counter 64 whose output is connected to a comparison input 65 of the coincidence circuit 62, with an input 66 serving as a count input for the control unit 22. The control unit 22 comprises also a switch 67 the control input of which serves as the "sense of displacement" input 30 of the unit 10 and is joined to a control input 68 of the bidirectional counter 64, a clock input 69 of which is joined to the "reset" input of the logical OR circuit 61.

The synchronization unit 23 comprises a logical AND circuit 70 whose inputs 71,72 are connected to the output of the clock pulse generator 58 and to the Q-output of the flip-flop 59, its output serving as the clock pulse output 24 of the unit 10. The unit 23 comprises also: a one-shot multivibrator 73 with its inverted output joined to an input 74 of the logical AND circuit 70, and its input—to the P-output of the flip-flop 59; a second logical AND circuit 75 with its inputs 76,77 and 78 joined to the P-output of the flip-flop 60, to the Q-output of the flip-flop 59 and to the output of the switch 67, and its output serving as the control output 25 of the unit 10 for setting the magnitude and sense of the holder displacement. The unit 23 comprises a third logical AND circuit 79 with its input 80 joined to the output of the switch 67, and its output—to the complementary C-input of the flip-flop 60; a fourth logical AND circuit 81 with its inputs 82 and 83 joined to the outputs of the logical AND circuits 70 and 75, respectively, and its output—to the count input 66 of the bidirectional counter 64.

The Johnson code distributor 19 comprises an n-digit Mobius ring counter 84, the count input of which is connected to the clock pulse output 24 of the sunchro unit 23, whereas its "reset" input is joined to the "reset" input 28 of the unit 10. The distributor 19 comprises also: a logical 2AND-to-2OR circuit, whose inputs 86,87,88 and 89 are joined to the Q-output of the l.s.d., to the P-output of the m.s.d., to the P-output of the l.s.d., and to the Q-output of the m.s.d., respectively, of the ring counter 84. The output of the 2AND-to-2OR circuit 85 is joined to the input 90 of the fourth logical AND circuit 81. The Mobius ring counter 84 comprises n D-type flip-flops. In the described embodiment it has two additional D-flip-flops according to the number of two redundant digits (N+1) and (N+2) inserted between the flip-flop which corresponds to the l.s.d. (1) and the flip-flop corresponding to the m.s.d. (N). The P- and Q-inputs of the flip-flop, representing the redundant digit (N+1), are joined to the inputs 91 and 92 of the switch 67.

The code-to-voltage converter 20 comprises a nonlinear Johnson-code-to-voltage converter 93, the inputs of which are joined to the Q-inputs of the flip-flops corresponding to the digits of the counter 84 from the l.s.d. (1) to the m.s.d. (N), and its output 94 being joined to the electromechanical means 13 of the step motor 9. The converter 20 comprises also a linear Johnson-code-to-voltage converter with its inputs likewise joined to the Q-inputs of the flip-flops corresponding to the digits of the counter 84 from the l.s.d. (1) to the m.s.d. (N); a comparator 96 whose input is joined to an output 97 of the linear converter 95; an analogue storage device 98 with its input 99 joined to the output 97 of the linear converter 95 via a gate 100, and its output joined to the other input 101 of the comparator 96. The output of the comparator 96 is joined to an input 102 of the third logical AND circuit 79. A control input 103 of the gate 100 is joined to the output of the logical OR circuit 61.

For better understanding the performance of the proposed device, the reference is now made to the signal diagrams in FIG. 6 where the x-axis is time, and y-axis represents voltages at the component outputs. For the sake of simplicity the Mobius ring counter 84 is shown to have 5 duty digits and 2 redundant digits the Q-outputs of which are not joined to the Johnson-code-to-voltage converters 93 and 95. FIG. 6a shows the signal at the clock pulse output 24 of the unit 10, FIG. 6b—the signal at the Q-output of the l.s.d. flip-flop (1) of the Mobius ring counter 84, FIG. 6c—the signal at the Q-output of the second-digit flip-flop of the ring counter 84, FIG. 6d—the signal at the Q-output of the third-digit flip-flop of the counter 84, FIG. 6e—the signal at the Q-output of the forth-digit flip-flop, FIG. 6f—the signal at the Q-output of the fifth-digit (N) flip-flop, FIG. 6g—the signal at the Q-output of the sixth-digit (N+1) flip-flop, and FIG. 6h—the signal at the Q-output of the seventh-digit (N+2) flip-flop in the Mobius ring counter 84. FIG. 6a shows the signal at the output 97 of the linear Johnson-code-to-voltage converter 95, and FIG. 6k—the signal at the P-output of the sixth-digit (N+1) flip-flop of the Mobius ring counter 84.

The performance of the top-entry transmission electron microscope according to the invention is described in the following. Since the principle of imaging in this microscope is the same as in the conventional makes, the description of the performance will refer to the operations to be carried out after having the specimen placed in the working gap of the pole-pieces 4, FIG. 1, and the electron optics adjusted. The step drive performance will be first described for tilting the specimen holder 3 without the z-control device. It is further assumed that the investigator's object of interest coincides with the tilt axis X of the specimen holder 3 and that the control of image position on the screen is unnecessary.

For driving the rocker 15, the control voltage shaper 11 generates a signal, FIG. 6a, which has a form of stepped trapezoid. These pulses cause the electromechanical means 13, FIG. 1, to perform oscillatory movements conveyed by the drive transmitting member 14 to the rocker 15 so that the rocker 15 is displaced longitudinally. The unit 10 for setting the magnitude and sence of the holder displacement generates a control signal for the rocker-position electromechanical means 17 synchronous with triangular pulses of the shaper 11 and having a square wave form, FIG. 6, in phase with either the front or the rear slopes of the triangular pulses of the shaper 11, FIG. 1. The movement of the rocker-position electromechanical means is also of oscillatory character. It is conveyed to the rocker 15 through thr rod 18 and the drive transmitting member 14 in the direction perpendicular to the microscope's optical axis. Superposition of the two oscillatory movements brings the end of rocker 15 facing the rotor 12 into periodical engagement with the rotor 12 causing the latter to turn by a set angle.

Practically required are angular displacements of the specimen holder 3 not multiple to an integral number of steps of the step motor 9.

The electrical circuit of the drive works as follows.

A voltage pulse at the "initial setting" input 27, FIG. 5, repeats at the output of the logical OR circuit 61. As a result, the P-output of the flip-flop 60 acquires the logical ONE potential, and the Q-output of flip-flop 59—the logical ZERO potential, while the gate 100 connects the input 99 of the analogue storage 98 to the output 97 of the linear Johnson-code-to-voltage converter 95 for a period equal to the duration of the setting pulse. The potentials at both inputs of the comparator 96 are equalized and square wave oscillations appear at its output which is connected to the input 102 of the third logical AND circuit 79 of the synchronization unit. The frequency of these square wave oscillations is determined by the parameters of a generator (not shown in FIG. 5) compensating the dead zone of the comparator 96. At the same time, the Q-outputs of all digits of the Mobius ring counter 84 and the bidirectional counter 64 get the potential of logical ZERO.

When a voltage pulse is fed to the "start" input 26, the Q-output of the flip-flop 59 and the inputs 72 and 76 of the logical AND circuits 70 and 75, connected with it, get the potential of logical ONE. The P-output of the flip-flop 60 gets the potential of logical ZERO. The first pulse coming from the output of comparator 96 (when the logical ONE potential is present at the input of the logical AND circuit 79) to the C-input of the flip-flop 60 puts the latter into the state of its P-output having the logical ONE potential. Since the D-input of the flip-flop 60 is constantly at the logical ONE potential, all succeeding pulses coming to its C-input do not affect its state. The flip-flop 60 is switched over by the C-input when the voltages at the inputs of comparator 96 are equal. It occurs only when the logical ONE potential is present at the output of switch 67 which is a prerequisite for the actuation of the electromechanical means 17 for rocker positioning; FIG. 1.

When the signals at all the three inputs 76,77,78, FIG. 5, of the logical AND circuit 75 coincide, the rocker-positioning electromechanical means 17, FIG. 3, is actuated, its working cycles being coincident with the signal cycles at the Q-output (or P-output, see FIGS. 6g and 6k) of the (N+1)-digit flip-flop of the Mobius ring counter 84, FIG. 5.

Switching of the flip-flop 60 by its synchronization C-input triggers the one-shot multivibrator 73. During the time the one-shot multivibratot 73 is ON, the pulses from the clock-pulse generator 58 cannot pass through the logical AND circuit 70 to the input of the Johnson code distributor 19. The pulse duration of the multivibrator 73 is somewhat longer than the working-process transient of the rocker-positioning electromechanical means 17, FIG. 1. This ensures maintaining the magnitude of the first step after restart, in the case when the logical ONE potential is present at the output of the switch 67, FIG. 5, at the starting moments.

The voltage clock pulses fed to the input of the Johnson code distributor 19, are, at the same time, fed to the input 82 of the logical AND circuit 81. But only those clock pulses pass to the output of the logical AND circuit 81 (i.e. to the input of the counter 64) which come at the actuation of the rocker-positioning electromechanical means 17, FIG. 1, which is ensured by the presence of the rocker-position control signal at the input 83 of the logical AND circuit 81, FIG. 5. When the redundant digits in the Mobius ring counter 84 in the Johnson code distributor are actuated, the logical 2AND-to-2OR circuit 85 forbids passing the said pulses even if the rocker-positioning electromechanical means 17 is actuated, FIG. 1. In this way, only those clock pulses are being stored in the bidirectional counter 64 whose passage has been followed by the displacement of rotor 12, FIG. 1, corresponding to one step of the control voltage at the electromechanical means 17 for turning the rotor.

The drive stops when the code of setting and the code stored in the bidirectional counter 64, FIG. 5, coincide. This causes a voltage pulse to appear at the output of the coincidence circuit 62 which is then fed to the input 63 of the logical OR circuit 61, and from the output of the latter—to the R-inputs of the flip-flops 59 and 60. The flip-flop 59 is switched to the state of having the logical ZERO potential at its Q-output, which inhibits the transmission of the clock pulses from the output of the clock pulse generator 58 to the input of the Johnson code distributor 19 through the logical AND circuit 70. The Q-outputs of the Mobius ring counter 84 register the state corresponding to a current voltage value at the output 94 of the non-linear converter 93 for the moment the drive stopped at. A lofical ZERO appears also at the output of the logical AND circuit 75, an output 77 of which is joined to the Q-output of the flip-flop 59, which causes the rocker 15, FIG. 3, to retract from the rotor 12 with the fixed voltage at the rotor-turning electromechanical means 13. The gate 100, FIG. 5, joins the input 99 of the analogue storing device 98 to the output 97 of the linear converter 95 for a period equal to the duration of the pulse generated by the comparison circuit 62 at the coincidence of codes. At the output of the analogue storing device 98 and at the first input of the comparator 96, there appears a voltage corresponding to the output voltage of the linear converter 95 at the moment the drive stopped. Manual stoppage may be performed at any moment by sending a voltage pulse to the "stop" input 27, which is exactly identical to the coincidence of codes in the circuit 62.

To reverse the motion of the rotor 12, one should send the "sense of displacement" instruction to the input 30 of the control unit 22, set a new displacement code at the input 31 of the control unit 22, and send a pulse to the input 26 of the control unit 22. This results in setting the logical ONE potential at the Q-output of the flip-flop 59, which causes the clock pulses to be fed to the input 24 of the Johnson code distributor 19, whereas the logical ZERO potential is established at the P-output of the flip-flop 60, which causes the output of the logical AND circuit 75 to keep the logical ZERO potential. The rocker-positioning electromechanical means 17 is not actuated, and the logical AND circuit does not let the clock pulses pass to the input of bidirectional counter 64. Thus, the Johnson code distributor 19 starts working when the rocker 15 is out of gear. When the (N+1)-th digit of the Mobius ring counter stores, its flip-flop outputs swap the states, which causes the logical ONE potential to appear at the output of the switch 67 and, consequently, at the output of the logical AND circuit 75. The voltage at the outputs 94 and 97 of the Johnson-code-to-voltage converters 93 and 95 after reaching its maximum starts diminishing with each new pulse arriving at the input of the Johnson code distributor 19. At the moment when the current value of voltage at the output of the linear Johnson code converter 95 becomes equal to the voltage at the output of the analogue storage 98, the comparator 96 generates a signal (square waveform) fed to the input 102 of the logical AND circuit 79, and, consequently, to the synchro C-input of the flip-flop 60, since a logical ONE signal is present at the input 80 of the logical AND circuit 79. The flip-flop 60 is switched into the state of its P-output having the logical ONE potential. The output of the logical AND circuit 75 becomes the logical ONE, whereas the one-shot multivibrator 73 inhibits the passage of clock pulses from the generator 58 to the input of the Johnson code distributor 19 via the logical AND circuit for the time sufficient for the actuation of the rocker-positioning electromechanical means 17, FIG. 3. After this, the Johnson code distributor 19, FIG. 5, goes on working, whereas the bidirectional counter 64 starts a reversed counting (substraction) till the set code coincides with the code of its current value at the coincidence circuit 62 in the same way as with the direct movement. After the set magnitude of displacement is achieved, thr rocker 15, FIG. 3, is disengaged once again, while the analogue storage 98 stores the value of voltage at the output 97 of the linear converter 95 at the moment of this new stop of the drive.

The described sequence of operations of blocks and units corresponds to the displacement of piezoelectric elements in the rotor-turning electromechanical means 13 which perform over one and the same partial hysteresis loop while executing the instruction set for any value and sense of displacement. This makes it possible to compensate for the non-linearity of working characteristics of the piezoelectric elements by simple conventional means.

A microobject under observation is registered with the tilt axis x of the specimen holder 3, FIG. 3, in the following way.

The rotor 12 of the step motor is set at a "step forward-step backward" oscillatory movement. To do this, the input 57 of the switch 39 is fed with the instruction, according to which the controlling output 25 of the unit 10 forsetting the magnitude and sense of the specimen holder's displacement is joined to the input 46 of the switch 39, and the output 40 of the switch 39—to a d.c. voltage source (not shown in FIGS.), the polarity and amplitude of which correspond to those of the signal at the controlling output 25 of the unit 10. In this mode of operation the brake pulley 4, FIG. 3, is periodically braked, synchronously with the "step forward, step backward" turns, by the rocker 50, the position of which is controlled by the electromechanical means 52 joined to the controlling output 25 of the unit 10 by the switch 39, FIG. 5. In accordance with the set sense-of-displacement signal, the crank 43, FIG. 3, cyclically displaces the link 36 along the pin 38 in the direction of the y-coordinate, FIG. 4. The specimen placed in the seat 37 moves together with the link 36. This mode of the drive operation is retained till the micro-object gets registered with the x-axis projection on the electron microscope screen. Keeping the "step forward, step backward" mode, one should increase the magnification of the electron microscope until the amplitude of image oscillations becomes not less than ⅓ of the screen size. After that, the electromechanical means 49 should be joined to the controlling output 25 of the unit 10 by means of the switch 39, FIG. 5. During this operation, the brake pulley 32, FIG. 3, is being periodically and synchronously with the "step forward, step backward" turns of the rotor 12 braked by the rocker 47, the position of which is controlled by the electromechanical means 49. In the meantime, the rocker 50 is kept in the out-of-gear state by the electromechanical means 52. In accordance with the sense-of-displacement signal set at the input 30 of the control unit 22, FIG. 5, the crank 35, FIG. 3, cyclically displaces the link 36 in the direction of the optical axis z. With the correct selection of the sense of motion along the z-axis, the amplitude of image oscillations on the electron microscope screen starts diminishing. The least possible amplitude of oscillations of the image corresonds to the optimum coincidence of the microobject under observation with the tilt axis x of the specimen holder 2.

The required value of magnification should be set, the switch 39, FIG. 1,—be put to the state which makes it feasible to perform the x-tilts (this state corresponds to the electromechanical means 17 being joined to the controlling output 25 of the unit 10).

What is claimed is:

1. A top-entry transmission electron microscope comprising:
   a stage,
   a removable cartridge housed in said stage,
   a specimen holder mounted in said removable cartridge,
   a magnetic lens, in the field of which is located said specimen holder mounted so that it can be tilted about the axis x perpendicular to the microscope's optical axis,
   an electric drive for said holder mechanically coupled with the latter,
   an actuating step motor of said electric drive mounted on said stage, a rotor of said actuating step motor having the axle coincident with said axis x and mechanically coupled with said specimen holder for the synchronous turning of said rotor and holder, a piezoelectrically actuated electromechanical means for turning said rotor, mechanically coupled with the latter, a drive-transmitting member of said step motor secured on said rotor-turning electromechanical means, a pivot secured in said removable cartridge, a rocker designed to convey drive to said rotor, geared to said drive transmitting member and secured on said pivot so that it can be displaced translationally with respect to said pivot, a piezoelectrically actuated electromechanical means for positioning said rocker, interacting with said drive transmitting member, a control voltage shaper for said step motor having an analogue output joined to said rotor-turning electromechanical means and a count input, a code-to-voltage converter for said control voltage shaper having an output serving as said analogue output for said control voltage shaper and an input, a Johnson code distributor for said input of said control voltage converter having an output joined to said input of said code-to-voltage converter, a unit for setting the magnitude and sense of holder displacement having an output for clock pulses and joined to said count input of said control voltage shaper, a control unit of said unit for setting the magnitude and sense of holder displacement having inputs, meant for receiving the signals of "start," "stop," "reset," "clock pulse frequency," "sense of displacement," "magnitude of displacement," and an output, a synchronization unit having an input joined to said output of said control unit, an output for clock pulses joined to said control voltage shaper, and a control output joined to said rocker-positioning electromechanical means.

2. A top-entry transmission electron microscope, as claimed in claim 1, comprising:
a mechanism for bringing the specimen into coincidence with the tilt axis x,
a bearing pulley of said coincidence mechanism mounted on said rotor so that it can be rotated about the tilt axis x,
a means for braking said bearing pulley with respect to the body of said removable cartridge having an electrical input,
a crank-link mechanism of said coincidence mechanism whose crank is mounted on said bearing pulley whereas its link pin is secured in said rotor perpendicularly to the tilt axis x and lies in the specimen plane,
a sent for housing said specimen provided in the body of said link of said crank-link mechanism,
a switch having an input joined to said control output of said synchronization unit, a first output joined to said rocker-positioning electromechanical means, and a second output joined to said electrical input of said bearing pulley braking means.

3. A top-entry transmission electron microscope, as claimed in claim 1, comprising:
a gear rim provided on said rotor,
a tooth provided at the end of said rocker engageable with said rotor and having a profile complementary to the tooth space profiles of said gear rim.

4. A top-entry transmission electron microscope, as claimed in claim 1, comprising:
an elastic cantilever element, serving as said pivot, bearing said rocker of said step motor, with one end being rigidly fixed in said removable cartridge body and the other bearing said rocker rigidly secured on this free end of said cantilever element.

5. A top-entry transmission electron microscope, as claimed in claim 1, comprising a friction increasing means provided on the end of said rocker of step motor to interact with said drive transmitting member.

6. A top-entry transmission electron microscope, as claimed in claim 2, comprising:
a mechanism for translating said link in the specimen plane,
a second bearing pulley with a crank of said link translating mechanism mounted on said rotor so that it can be rotated about the tilt axis x,
a means for braking said second bearing pulley with respect to said removable cartridge having an electrical input,
a slot provided in the body of said link of said crank-link mechanism perpendicular to its pin axis to house said crank of said second bearing pulley,
a second output of said switch connected with said electrical input of said braking means of said second bearing pulley.

7. A top-entry transmission electron microscope, as claimed in claim 2, comprising:
a braking rocker designed to interact with said bearing pulley,
a pivot secured to said removable cartridge bearing said braking rocker,
electromechanical means mounted on said stage and designed to interact with said braking rocker during braking.

8. A top-entry transmission electron microscope, as claimed in claim 6, comprising:
a second braking rocker designed to interact with said second bearing pulley,
a pivot secured in said removable cartridge bearing said second braking rocker,
a second electromechanical means mounted on said stage and designed to interact with said second braking rocker during braking.

9. A top-entry transmission electron microscope, as claimed in claim 7, comprising a friction increasing means provided on the end of said braking rocker to interact with said electromechanical means.

10. A top-entry transmission electron microscope, as claimed in claim 7, whose said first electromechanical means is piezoelectrically actuated.

11. A top-entry transmission electron microscope, as claimed in claim 8, comprising a friction increasing means provided on said second braking rocker to interact with said second electromechanical means.

12. A top-entry transmission electron microscope, as claimed in claim 8, whose said second electromechanical means is piezoelectrically actuated.

13. A top-entry transmission electron microscope comprising:
a stage,
a removable cartridge housed in said stage,
a specimen holder mounted in said removable cartridge, a magnetic lens, in the field of which is located said specimen holder mounted so that it can be tilted about the axis x perpendicular to the microscope's optical axis, an electric drive for said holder mechanically coupled with the latter and having an actuating step motor mounted on said stage, a rotor of said actuating step motor having the axle coincident with said axis x and mechanically coupled with said specimen holder for the synchronous turning of said rotor and said specimen holder, a piezoelectrically actuated electromechanical means for turning said rotor mechanically coupled with said rotor, a drive-transmitting member of said step motor secured on said rotor-turning electromechanical means, a pivot secured in said removable cartridge, a rocker designed to convey drive to said rotor geared to said drive transmitting member and secured on said pivot so that it can move lengthwise with respect to this pivot, a piezoelectrically actuated electromechanical means for positioning said rocker and interacting with said drive-transmitting member, a control voltage shaper having an analogue output joined to said rotor-turning electromechanical means and a count input, a code-to-voltage converter of said control voltage shaper having an output, serving as said analogue output for said control voltage shaper, and an input, a Johnson code distributor of said control voltage shaper having an output joined to said input of said code-to-voltage converter, a unit for setting the magnitude and sense of holder displacement having a clock pulse output joined to said count input of control voltage shaper, a control unit for said unit for setting the magnitude and sense of holder displacement having inputs, meant for receiving the signals of "start," "stop, " "reset," "clock pulse frequency," "sense of displacement," "magnitude of displacement," and an ouput, a synchronization unit having an input, joined to said output of said control unit, an output of clock pulses, joined to said control voltage shaper, and a control output, joined to said rocker-positioning electromechanical means, a clock pulse generator of said control unit having an input, serving as said "clock pulse frequency" input of said unit for setting the magnitude and sense of holder displacement, and an output, a flip-flop of said control unit having an S-input, serving as a "start" input for said unit for setting the magnitude and sense of holder displacement, an R-input and a Q-input, a second flip-flop of said control unit having an S-input, connected to said S-input of said first flip-flop, an R-input, joined to said R-input of said first flip-flop, a P-output and a count (complementary) input, a logical OR circuit of said control unit having a first and a second input, serving as "stop" and "reset" inputs of said unit for setting the magnitude and sense of holder displacement, an output joined to said P-inputs of said flip-flops and a third input, a coincidence circuit for the codes of set and current values of rotor displacement of said control unit having an input, serving as the "magnitude of displacement" input of said unit for setting the magnitude and sense of holder displacement, an output joined to said third input of said logical OR circuit, and a comparison input, a bidirectional counter of said control unit having an output joined to said comparison input of said coincidence circuit, an input serving as said count input of said control unit, a synchronization input joined to said second input of said logical OR circuit, and a control input, a switch of said control unit having an input, serving as the "sense of displacement" input of said unit for setting the magnitude and sense of holder displacement and joined to said control input of said bidirectional counter, also having a second, a third input, and an output.

14. A top-entry transmission electron microscope, as claimed in claim 13, comprising a first logical AND circuit of said synchronization unit having a first input, joined to said output of said clock pulse generator and to said Q-output of said first flip-flop, an output serving as said clock pulse output of said synchronization unit, and a second input, a one-shot multivibrator of said synchronization unit having an inverted output, joined to said second input of said first logical AND circuit, and an input joined to said P-output of said second flip-flop, a second logical AND circuit of said synchronization unit having a first input, joined to said P-output of said second flip-flop, a second input joined to said Q-output of said first flip-flop, a third input joined to said output of said switch of said control unit, and an output serving as the control output of said unit for setting the magnitude and sense of holder displacement, a third logical AND circuit of said synchronization unit having an input, joined to said output of said switch of said control unit, and an output joined to said complementary input of said second flip-flop, a fourth logical AND circuit of said synchronization unit having an input, joined to said output of said first logical AND circuit, a second input joined to said output of said second logical AND circuit, and an output joined to said count input of said bidirectional counter.

15. A top-entry transmission electron microscope, as claimed in claim 14, comprising— an n-digit Mobius ring counter of said Johnson code distributor having n inputs in accordance with the number of digits, a count input joined to said clock pulse output of said synchronization unit, a "reset" input joined to said "reset" input of said unit for setting the magnitude and sense of holder displacement, Q- and P-outputs of the least significant digit and Q- and P-outputs of the most significant digit, a logical 2AND-to-2OR circuit of said distributor having a first input, joined to said Q-output of the l.s.d. of said Mobius ring counter, a second input joined to said P-output of the m.s.d. of said Mobius ring counter, a third input joined to said P-output of the l.s.d. of said Mobius ring counter, and a fourth input joined to said Q-output of the m.s.d. of said Mobius ring counter, an output of said third input of said fourth logical AND circuit of said synchronization unit, at least one redundant digit of said Mobius ring counter having an output, joined to said l.s.d., and an input joined to said m.s.d. of said Mobius ring counter, also having P- and Q-outputs joined to said second and third inputs of said switch of said control unit.

16. A top-entry transmission electron microscope, as claimed in claim 15, comprising a non-linear Johnson-code-to-voltage converter of said code-to-voltage converter having n inputs joined to said n outputs of said Mobius ring counter, and an output joined to said electromechanical means of said step motor, a linear Johnson-code-to-voltage converter of said code-to-voltage converter having n inputs, joined to said n outputs of said Mobius ring counter, and an output, a comparator of said code-to-voltage converter having an input, joined to said output of said linear Johnson-code-to-voltage converter, an output joined to said input of said third logical AND circuit of said synchronization unit, and a second input, a gate of said code-to-voltage converter having a control input, joined to said output of said logical OR circuit of said control unit, a second input joined to said output of said linear converter, and an output, an analogue storage of said converter having an input, joined to said output of said gate, and an output joined to said second input of said converter.

* * * * *